United States Patent
Bauer et al.

(10) Patent No.: US 7,911,039 B2
(45) Date of Patent: Mar. 22, 2011

(54) COMPONENT ARRANGEMENT COMPRISING A CARRIER

(75) Inventors: Michael Bauer, Nittendorf (DE); Alfred Haimerl, Sinzing (DE); Angela Kessler, Regensburg (DE); Joachim Mahler, Regensburg (DE); Wolfgang Schober, Amberg (DE)

(73) Assignee: Infineon Technologies AG, Neubiberg (DE)

( * ) Notice: Subject to any disclaimer, the term of this patent is extended or adjusted under 35 U.S.C. 154(b) by 531 days.

(21) Appl. No.: 11/860,556

(22) Filed: Sep. 25, 2007

(65) Prior Publication Data

US 2008/0111216 A1    May 15, 2008

(30) Foreign Application Priority Data

Sep. 26, 2006 (DE) .......... 10 2006 045 415

(51) Int. Cl.
*H01L 23/495* (2006.01)
(52) U.S. Cl. .......... 257/669; 257/666; 257/E23.038
(58) Field of Classification Search .......... 257/669, 257/666, E23.038
See application file for complete search history.

(56) References Cited

U.S. PATENT DOCUMENTS

| | | | | |
|---|---|---|---|---|
| 4,884,124 A | * | 11/1989 | Mori et al. | 257/783 |
| 4,918,511 A | * | 4/1990 | Brown | 257/669 |
| 4,924,454 A | * | 5/1990 | Baas | 369/44.25 |
| 4,942,452 A | * | 7/1990 | Kitano et al. | 257/666 |
| 4,994,895 A | * | 2/1991 | Matsuzaki et al. | 257/791 |
| 5,175,610 A | * | 12/1992 | Kobayashi | 257/676 |
| 5,264,730 A | * | 11/1993 | Matsuzaki et al. | 257/787 |
| 5,397,915 A | * | 3/1995 | Nose | 257/676 |
| 5,969,411 A | * | 10/1999 | Fukaya | 257/666 |
| 6,015,722 A | | 1/2000 | Banks et al. | |
| 6,228,688 B1 | | 5/2001 | Ohta et al. | |
| 2002/0115237 A1 | | 8/2002 | Williams | |

OTHER PUBLICATIONS

IXYS, What is DCB, pp. 35-36, IXYS reserves the right to change limits, test conditions and dimensions, 2004, IXYS, http://ixdev.ixys.com/DataSheet/5aae9048-f323-4b31-b627-c1aae9b1cb23.pdf.
P. Carrère et al., New Encapsulation Technique Using Standar DBC Substrates Technology, May 1998, pp. 2103-2107, IEEE Xplore, Print ISBN: 0-7803-4489-8.

* cited by examiner

*Primary Examiner* — Nitin Parekh
(74) *Attorney, Agent, or Firm* — Infineon Technologies AG Patent Department

(57) ABSTRACT

A component arrangement comprising a carrier, a component in a housing with electrical contacts and a moulding compound that encloses the carrier, the semiconductor component in the housing and the electrical contacts, wherein the component is applied on the carrier, and wherein the carrier is provided with holes, and a method for producing a component arrangement, wherein the carrier is provided with holes, the component is positioned on the carrier, the component is connected to the carrier, the component with the carrier is positioned in the leadframe, and this arrangement is enclosed by a moulding compound.

16 Claims, 3 Drawing Sheets

COMPONENT ARRANGEMENT COMPRISING A CARRIER

FIELD OF THE INVENTION

The invention relates to a component arrangement comprising at least one carrier, and a method for producing the component arrangement.

BACKGROUND

Semiconductor components, such as integrated circuits or individual semiconductors, are generally applied on a carrier. The semiconductor component is encapsulated by a moulding compound. The cured moulding compound gives the semiconductor component a desired form, protects the semiconductor component against environmental influences and enables a robust identification of the encapsulated semiconductor component. Strips which are connected to bonding wires and which are not completely encapsulated by the moulding compound enable electrical contact externally.

In terms of its composition, the moulding compound should be configured in such a way that it completely encapsulates the semiconductor component and reliably adheres on the surface of the semiconductor component and of the carrier. In addition, the moulding compound must be constituted in such a way that it can reliably flow around all irregularities of the arrangement with the semiconductor component and the carrier and can penetrate into any void or any gap in said arrangement.

The size of the particles of the moulding compound, the granulation, should be chosen such that the moulding compound can penetrate into any gap. If the granulation of the moulding compound is not small enough, then the problem can occur that only the resins of the moulding compound penetrate into small gaps in the arrangement or the gaps are blocked by fillers. The unfilled cavities resulting from this reduce the reliability of the component arrangement.

Arrangements composed of electrical components and carriers that are to be encapsulated with moulding compound have irregular elevations and gaps which make it more difficult for moulding compound to flow around said arrangements.

SUMMARY

Therefore, the present invention is based on the object of configuring an arrangement composed of semiconductor components or other electrical components, such as capacitors or coils, and carriers in such a way that said arrangement is completely encapsulated by the moulding compound.

According to the invention, this object is achieved by means of a component arrangement having the features of Claim 1 and by means of a method having the features of Claim 8. The subclaims each define preferred advantageous embodiments.

BRIEF DESCRIPTION OF THE DRAWINGS

Embodiments of the invention are explained in more detail below with reference to the accompanying drawings, in which.

DETAILED DESCRIPTION

Figure 1:
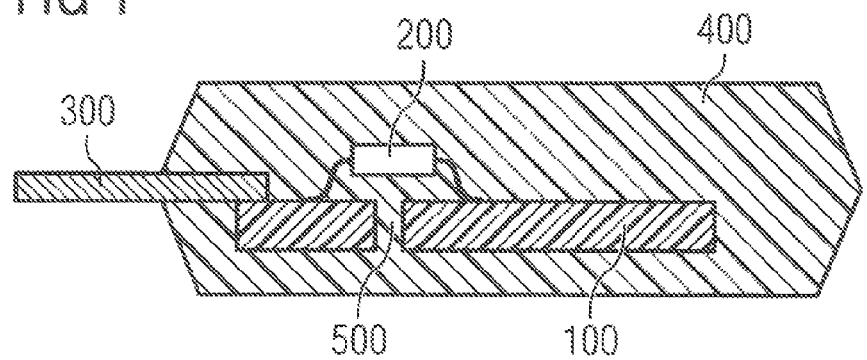
FIG. 1 shows the side view in section of an exemplary embodiment with one component on one carrier.

FIG. 1 shows a side view in section of a component arrangement comprising a carrier 100, comprising a semiconductor component 200, a plurality of contact strips 300, which is encapsulated by a moulding compound. The contact strips 300 are directly connected to the carrier 100. An electrical connection between the carrier 100 and the contact strips 300 can be obtained by means of a solder. The carrier 100 can be a carrier such as is usually used for the mounting of electronic components. Such a carrier is referred to as a PCB (printed circuit board). Electronic components are positioned on a PCB, fixed by means of a solder and electrically connected to the PCB. Arrangements on a PCB can be sprayed or encapsulated with a resin by moulding in order to shield said arrangement from environmental influences.

At least one semiconductor component 200 is applied on the carrier 100, said component, for its part, being situated in a housing. This arrangement is subsequently encapsulated by moulding with a moulding compound, which also gives this arrangement the external form.

Externally, the finished component arrangement can no longer be distinguished from a conventional electronic component.

A hole 500 can be introduced in the carrier below a component 200. The component arrangement in FIG. 1 therefore comprises a carrier, a component in a housing, electrical contacts and a moulding compound that encloses the carrier, the component in the housing and the electrical contacts, wherein the component is applied on the carrier, and wherein the carrier is provided with holes. With regard to the electrical contacts of the component arrangement, it should thus be understood that the electrical contacts are only partly enclosed by the moulding compound.

In FIG. 1, the hole is arranged directly below the component 200. By virtue of this arrangement, the moulding compound of the component arrangement can also pass below the component 200. A narrow gap into which the moulding compound cannot penetrate is thus avoided. The hole can be configured in such a way that it merely makes it easier for the moulding compound to fill the cavity below the component 200. If the diameter of the hole is larger than the gap between the component 200 and the carrier 100, it is ensured that the moulding compound can penetrate into the gap. A further configuration is to configure the hole in such a way that the entire region below the component 200 is open, such that a relatively large gap does not arise below the component 200. This configuration of the carrier of the component arrangement affords the particular advantage that a special moulding compound does not have to be used. Thus, this arrangement according to the invention can also be encapsulated by a moulding compound that does not have particularly fine granulation.

Figure 2:
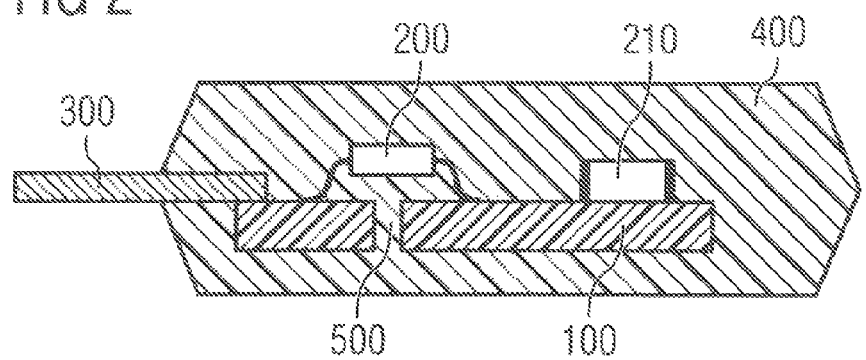
FIG. 2 shows the side view in section of an exemplary embodiment with two components on one carrier.

FIG. 2 shows a side view in section of a component arrangement comprising a carrier 100, comprising a semiconductor component 200, comprising a passive component 210 and a plurality of contact strips 300, which is encapsulated by a moulding compound. The contact strips 300 are directly connected to the carrier 100.

The passive component 210 bears directly on the carrier 200. If a component bears so closely on the carrier 100 that no gap arises below the component, then it is not necessary to provide a hole below the component. This fact is illustrated by the component 210 in FIG. 2.

Figure 3:
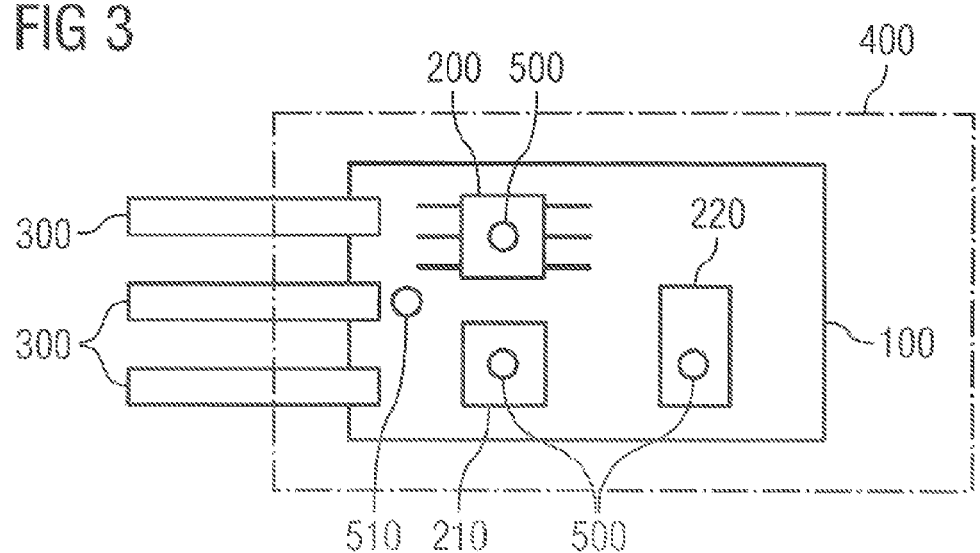
FIG. 3 shows the plan view in section of an exemplary embodiment with a plurality of components on one carrier.

FIG. 3 shows a plan view in section of a component arrangement comprising a carrier 100, comprising a semiconductor component 200, comprising a passive component 210, a further component 220 and a plurality of contact strips 300. The contact strips 300 are directly connected to the carrier 100. The exemplary embodiment in FIG. 3 shows how holes are to be arranged on a carrier 100. A hole is present below each component 200, 210, 220 in order that the cavities below said components can be reliably filled with the moulding compound. A further hole 510 is provided in addition to the holes 500 below the components. In the component arrangement in FIG. 3, the components 200, 210, 220 form a barrier that impedes the inflow of the moulding compound for encapsulating the arrangement. One possibility for enabling the unimpeded inflow of the moulding compound is to arrange the components 200, 210, 220 differently on the carrier 100. This appears to be readily possible in the case of a simple exemplary embodiment as in FIG. 3. However, such a rearrangement of the components is generally associated with disadvantages. The most significant disadvantage is that the components can no longer be optimally arranged electrically on the carrier 100. The hole 510 shown in FIG. 3 has the particular advantage that the components 200, 210, 220 can be arranged in such a way that the entire component arrangement in FIG. 3 has optimal electrical properties. The hole 510 in FIG. 3 serves to enable the moulding compound to flow around the components 200, 210, 220, or to control the flow of moulding compound in such a way that no cavities arise in the component arrangement. In FIG. 3, the hole has a circular form; a different form is also possible. Thus, by way of examples the hole can also be embodied as an elongated rectangle extending over the carrier. Furthermore, an arrangement of a plurality of holes lying alongside one another is also possible in order to enable the inflow of moulding compound.

Figure 4:
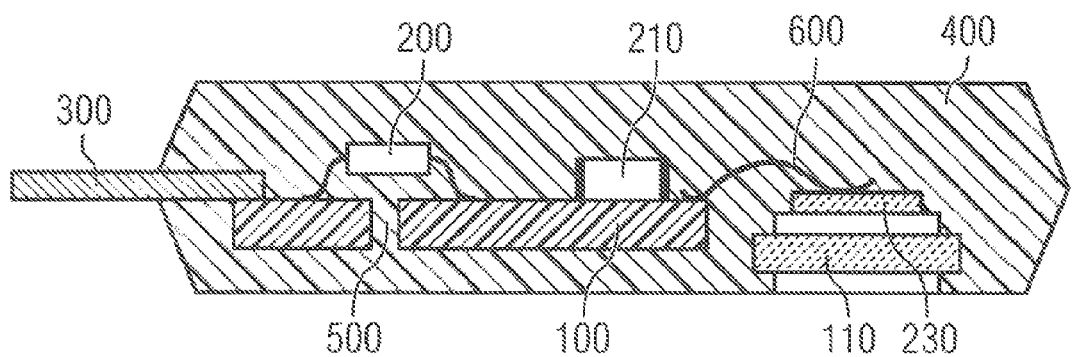
FIG. 4 shows the side view in section of an exemplary embodiment with a plurality of components on two or more carriers.

FIG. 4 shows a side view in section of a component arrangement comprising a carrier 100, comprising a semiconductor component 200, comprising a passive component 210, a further carrier 110, comprising a component 230 and a plurality of contact strips 300, which is encapsulated by a moulding compound. The contact strips 300 are directly connected to the carrier 100. The carrier 110 is electrically connected to the carrier 100 by means of bonding wires.

In the exemplary embodiment in FIG. 4, the carrier 110 is a DCB carrier (DCB: direct copper bonding), on the surface of which is applied a semiconductor component 230 without a housing. A DCB carrier is a carrier comprising a plurality of metallic layers and at least one ceramic layer (or electrically insulating layer). Such DCB carriers have the advantage that the electrical conductivity of the carrier is very low and the thermal conductivity of the carrier is very high.

FIG. 4 therefore shows a component arrangement in which semiconductor components in housings, passive components and power semiconductor components without a housing are arranged on a plurality of carriers, which is encapsulated in shaping fashion by a moulding compound. This component arrangement reveals the advantage afforded by forming the holes in at least one carrier; all the components can be arranged in such a way that good electrical properties of the component arrangement result.

Figure 5:
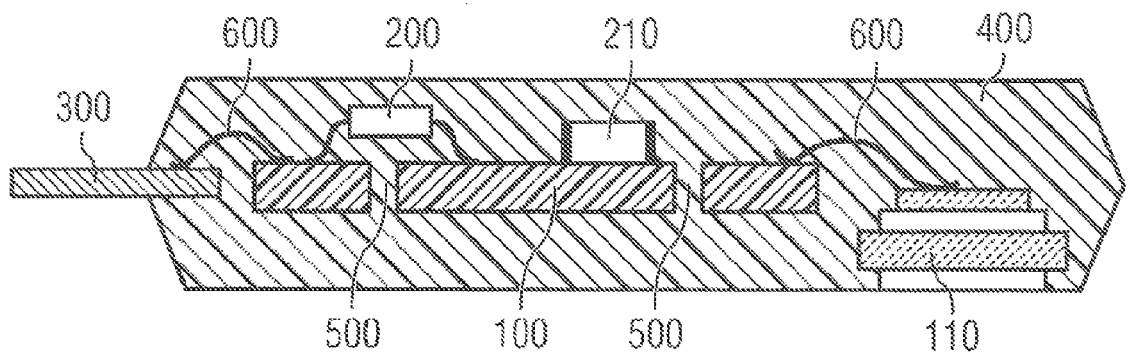
FIG. 5 shows the side view in section of an exemplary embodiment with a plurality of components on two or more carriers.

FIG. 5 shows a component arrangement as in FIG. 4 with the difference that the carrier 100 is not directly connected to the contact strips 300. The electrical connection is effected by means of bonding wires in this exemplary embodiment. The component arrangement can be configured even more flexibly by virtue of connection by means of bonding wires.

Figure 6:
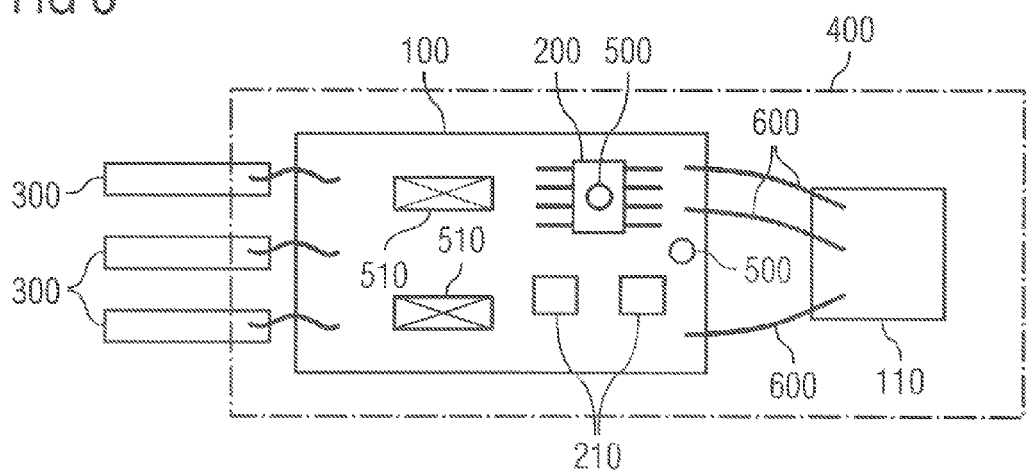
FIG. 6 shows the plan view in section of an exemplary embodiment with a plurality of components on two carriers.

FIG. 6 shows a plan view in section of a component arrangement comprising a carrier 100, comprising a semiconductor component 200, comprising a passive component 210, a further component 220, a plurality of contact strips 300 and a further carrier 110, which is encapsulated by a moulding compound. The contact strips 300 are connected to the carrier 100 by means of bonding wires. The exemplary embodiment in FIG. 4 shows how holes can be arranged on a carrier 100. A hole is present below each component 200, 210, 220 in order that the cavities below said components can be reliably filled with the moulding compound. Further holes 510 are provided in addition to the holes 500 below the components. In the component arrangement in FIG. 6, the components 200, 210, 220 form a barrier that impedes the inflow of moulding compound for encapsulating the arrangement. The holes 510 shown in FIG. 6 have the particular advantage that the components 200, 210, 220 can be arranged in such a way that the entire component arrangement in FIG. 6 has optimal electrical properties. The holes 510 in FIG. 6 serve to enable the moulding compound to flow around the components 200, 210, 220. In FIG. 6, the hole has a rectangular form, other forms also being possible.

Figure 7:
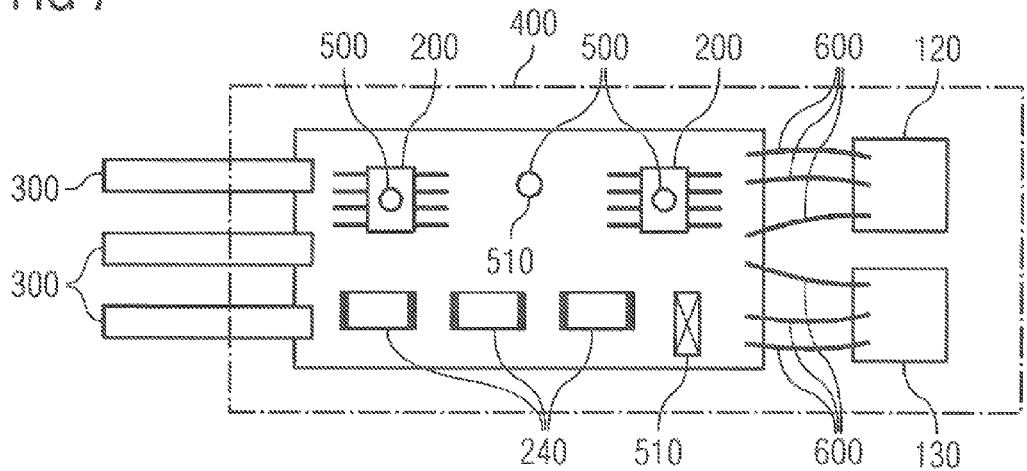
FIG. 7 shows the plan view in section of an exemplary embodiment with a plurality of components on a plurality of carriers.

FIG. 7 shows a plan view of a component arrangement comprising a carrier 100, comprising a semiconductor component 200, comprising a passive component 210, a further component 220, a plurality of contact strips 300 and two further carriers 120, 130, which is encapsulated by a moulding compound. The contact strips 300 are directly connected to the carrier 100. The exemplary embodiment in FIG. 7 shows how holes can be arranged on a carrier 100. A hole is present below each component 200, 210, 220 in order that the cavities below said components can be reliably filled with the moulding compound. Further holes are provided in addition to the holes 500 below the components. In the component arrangement in FIG. 7, the components 240 form a barrier that impedes the inflow of moulding compound for encapsulating the arrangement. The holes 500, 510 shown in FIG. 7 have the particular advantage that the components 240 can be arranged in such a way that the entire component arrangement in FIG. 7 has optimal electrical properties. The holes 510 in FIG. 7 serve to enable the moulding compound to flow around the components 240. In FIG. 7, a hole has a rectangular form, other forms also being possible.

The invention claimed is:
1. Component arrangement comprising:
a carrier,
a component in a housing,
electrical contacts,
a moulding compound that completely encloses the carrier and the component in the housing and partly encloses the electrical contacts,
wherein the component is applied on the carrier,
wherein the carrier is provided with holes, wherein at least one of the holes is formed below the component, and
wherein an entire region directly below the component having a gap above and between the carrier is open to the moulding compound.

2. Component arrangement according to claim 1, wherein the component in the housing is a semiconductor component.

3. Component arrangement according claim 1, wherein one of the holes is located directly below the component.

4. Component arrangement according claim 1, wherein the holes are formed alongside the component.

5. Component arrangement according to claim 1, wherein the carrier is a printed circuit board.

6. Component arrangement according to claim 1, further comprising:
   wherein diameter of the at least one of the holes formed below the component is larger than a gap between the carrier and the component.

7. Component arrangement according to claim 6, wherein the gap between the carrier and the component is filled with the moulding compound.

8. Component arrangement according to claim 1, further comprising:
   a cavity below the component and wherein the cavity is filled with the moulding compound.

9. Component arrangement according to claim 1, wherein the component is a barrier impeding inflow of the moulding compound.

10. Component arrangement according to claim 1, wherein the moulding compound is disposed around the component.

11. Component arrangement according to claim 1, wherein the holes are in a circular form.

12. Component arrangement according to claim 1, wherein the holes are in an elongated rectangle form extending over the carrier.

13. Component arrangement according to claim 1, wherein the component is a passive component.

14. Component arrangement comprising:
    a carrier,
    a component in a housing,
    electrical contacts,
    a moulding compound that completely encloses the carrier and the component in the housing and partly encloses the electrical contacts,
    wherein the component is applied on the carrier and wherein the carrier is provides with holes,
    wherein the electrical contacts are directly connected to the carrier, and
    wherein an entire region directly below the component having a gap above and between the carrier is open to the moulding compound.

15. Component arrangement according to claim 14, wherein the electrical contacts are contact strips and wherein the contact strips are directly connected to the carrier.

16. Component arrangement according to claim 14, wherein the electrical contacts and the carrier connected by means of a solder.

* * * * *